United States Patent
Okabe et al.

(10) Patent No.: US 7,810,383 B2
(45) Date of Patent: Oct. 12, 2010

(54) METHOD FOR EVALUATING SEMICONDUCTOR WAFER, APPARATUS FOR EVALUATING SEMICONDUCTOR WAFER, AND METHOD FOR MANUFACTURING SEMICONDUCTOR WAFER

(75) Inventors: Keiichi Okabe, Nagano (JP); Hisakazu Takano, Nagano (JP); Daisuke Nakamata, Nagano (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 504 days.

(21) Appl. No.: 11/886,266

(22) PCT Filed: Mar. 24, 2006

(86) PCT No.: PCT/JP2006/305911

§ 371 (c)(1),
(2), (4) Date: Sep. 13, 2007

(87) PCT Pub. No.: WO2006/109502

PCT Pub. Date: Oct. 19, 2006

(65) Prior Publication Data

US 2008/0166823 A1    Jul. 10, 2008

(30) Foreign Application Priority Data

Apr. 8, 2005    (JP)    ............................. 2005-111633

(51) Int. Cl.
*G01B 5/28* (2006.01)
(52) U.S. Cl. ....................................................... 73/105
(58) Field of Classification Search ..................... 73/105
See application file for complete search history.

(56) References Cited

U.S. PATENT DOCUMENTS

| 6,709,981 B2 * | 3/2004 | Grabbe et al. ............... 438/692 |
| 2003/0170948 A1 * | 9/2003 | Bhagavat et al. ............ 438/200 |
| 2004/0215418 A1 | 10/2004 | Kobayashi et al. |

FOREIGN PATENT DOCUMENTS

| JP | A 7-106387 | 4/1995 |
| JP | A 11-287630 | 10/1999 |
| JP | A 2002-538447 | 11/2002 |
| JP | A 2003-086646 | 3/2003 |
| JP | A 2004-020286 | 1/2004 |
| JP | A 2004-214505 | 7/2004 |
| JP | A 2004-216485 | 8/2004 |
| WO | WO 00/52420 A1 | 9/2000 |

* cited by examiner

*Primary Examiner*—Hezron Williams
*Assistant Examiner*—Rodney T Frank
(74) *Attorney, Agent, or Firm*—Oliff & Berridge, PLC

(57) ABSTRACT

The present invention provides a method for evaluating nanotopography of a surface of a semiconductor wafer sliced from a semiconductor ingot, the method being conducted prior to polishing of the surface, the method at least comprising: measuring a surface profile of the wafer in the direction that the wafer is sliced; determining a maximum inclination value of warp change of the wafer surface in a sectional profile in the direction that the wafer is sliced of the measured surface profile; and estimating nanotopography of the wafer surface after being polished based on the determined maximum value. As a result, there are provided a method and an apparatus for evaluating nanotopography of a surface of a semiconductor wafer, and a method for manufacturing a semiconductor wafer exhibiting good nanotopography level on the surface.

20 Claims, 6 Drawing Sheets

METHOD FOR EVALUATING SEMICONDUCTOR WAFER, APPARATUS FOR EVALUATING SEMICONDUCTOR WAFER, AND METHOD FOR MANUFACTURING SEMICONDUCTOR WAFER

TECHNICAL FIELD

The present invention relates to a method and an apparatus for evaluating a semiconductor wafer, and a method for manufacturing a semiconductor wafer. More specifically, the present invention relates to a method and an apparatus for evaluating nanotopography of a surface of a semiconductor wafer, and a method for manufacturing a semiconductor wafer exhibiting good nanotopography level on the surface.

BACKGROUND ART

A typical method for manufacturing semiconductor wafers such as silicon wafers includes a slicing step of slicing a semiconductor ingot into disklike wafers; a chamfering step of chamfering the outer periphery of each wafer for the purpose of preventing cracking or chipping of the wafers; a lapping step of planarizing the wafers; an etching step of removing mechanical damage remained in the surface layer of each wafer; a polishing step of mirror-polishing the surface of each wafer; and a cleaning step of removing contaminants such as polishing agents or foreign matters adhered in the polishing step. When necessary, steps such as a heat treatment or grinding can be further conducted in the above steps. Furthermore, the sequence of the above steps can be altered, or a step can be repeated.

By the way, as making to high integration of semiconductor devices have been achieved in recent years, processes such as STI (shallow trench isolation) are used as micro device fabrication techniques. Therefore, in order to form circuitry patterns on the surface of a silicon wafer, an insulator film that is more even and has a uniform thickness is required. Then, for example, a method for planarizing an insulator film by CMP (chemical mechanical polishing) is used in the processes for manufacturing semiconductor devices.

Conventionally, micro uneven shapes (hereafter, referred to as waviness) on semiconductor wafer surfaces do not affect the processes for manufacturing semiconductor devices. However, in the STI, convex parts are selectively polished by CMP. Thus there occurs a problem that an insulator film has an uneven thickness due to the waviness.

The waviness is indicated by a parameter called nanotopography. The nanotopography is an indicator which show the flatness of a wafer surface, and indicates waviness within a spatial wavelength of 0.1 mm to several tens of mm of a wafer surface in a state of non-adsorption.

The nanotopography is generally measured with an apparatus such as a Nanomapper from ADE Corporation, a Nano-Pro from KLA-Tencor Corporation, or a Dynasearch from RAYTEX CORPORATION. These apparatus are optical types and the nanotopography is measured by using surface reflection of an object to be measured. Therefore, a wafer to be measured is required to have a mirror surface having a high reflectivity to some extent. Consequently, polished wafers are generally measured in terms of nanotopography.

By the way, in order to evaluate a process of slicing wafers from a semiconductor ingot, there are disclosed techniques of measuring the surface profile of a wafer in the state of as-cut, namely not being processed after being sliced (see Japanese Patent Application Laid-open (kokai) No. 07-106387; and Published Japanese Translations of PCT International Publication No. 2002-538447). In this way, wafers in the state of as-cut are measured for the purpose of evaluating the surface profile of the wafers in the state of as-cut and adjusting slicing conditions so as not to cause the waviness on slicing because the waviness generated on slicing can remain even after the wafers are subjected to subsequent processes such as lapping or polishing. Conventional parameters of representing surface conditions measured in the state of as-cut are warpage, warp, and the like.

However, the parameters based on the surface conditions of a wafer measured in the state of as-cut are not in correlation with nanotopography of the surface of the wafer after being polished. Therefore, in order to evaluate nanotopography of a wafer surface, it is necessary to conduct the evaluation after the wafer is subjected to a polishing step.

Therefore, in order to increase the efficiency of manufacturing wafers, there is a desire for a method in which nanotopography can be evaluated in a stage of a manufacturing process as early as possible.

DISCLOSURE OF THE INVENTION

An object of the present invention is to provide a method and an apparatus for evaluating nanotopography of a surface of a semiconductor wafer, and a method for manufacturing a semiconductor wafer with a surface having good level of nanotopography.

In order to achieve the object, the present invention provides a method for evaluating nanotopography of a surface of a semiconductor wafer sliced from a semiconductor ingot, the method being conducted prior to polishing of the surface, the method at least comprising: measuring a surface profile of the wafer in the direction that the wafer is sliced; determining a maximum inclination value of warp change of the wafer surface in a sectional profile in the direction that the wafer is sliced of the measured surface profile; and estimating nanotopography of the wafer surface after being polished based on the determined maximum value.

In this way, prior to polishing of the surface of a wafer, at least, the surface profile of the wafer is measured in the direction that the wafer is sliced; and a maximum inclination value of warp change of the wafer surface is determined in a sectional profile in the direction that the wafer is sliced of the measured surface profile. Thus obtained maximum value shows a strong correlation with nanotopography of the wafer surface after being polished. As a result, nanotopography of the polished wafer surface can be accurately estimated based on the surface profile prior to polishing.

In the above case, the maximum inclination value of warp change to be determined is preferably defined as a maximum value among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or the maximum inclination value of warp change is defined as a value obtained by dividing a warp variation by a distance between where the warp starts changing and where the warp finishes changing.

In this way, the maximum inclination value of warp change to be determined is defined as a maximum value (hereafter, referred to as Line Δ Warp) among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or the maximum inclination value of warp change is defined as a value (hereafter, referred to as degree of Warp change) obtained by dividing a warp variation by a distance between where the warp starts changing and where the warp finishes changing. In this case, the maximum inclination value shows a particularly strong correlation with nanotopography of the wafer surface after being polished. As a result, nanotopography of the polished wafer surface can be accurately estimated prior to polishing of the wafer surface.

Furthermore, the width of the measurement range is preferably equal to or less than 20 mm.

In this way, when the width of the measurement range is equal to or less than 20 mm, the Line Δ Warp shows a stronger correlation with nanotopography of the wafer surface after being polished.

Furthermore, the wafer is preferably subjected to the measuring of a surface profile in a state of as-cut, namely not being processed after the slicing.

In this way, when the wafer is subjected to the measuring of a surface profile in a state of as-cut, namely not being processed after the slicing, nanotopography of the wafer surface can be evaluated in an early stage of a wafer manufacturing process. Thus slicing conditions or the like are swiftly controlled in response to thus-obtained results, whereby productivity of wafers can be increased.

Furthermore, the sectional profile is preferably subjected to a smoothing process and then the maximum inclination value of warp change is determined.

In this way, the sectional profile is subjected to a smoothing process such as a method of moving averages, a method of moving median, or a polynomial-based smoothing method and then the maximum inclination value of warp change is determined. Thus obtained maximum value shows a stronger correlation with nanotopography of the wafer surface after being polished.

In the above case, the smoothing process is preferably conducted by a method of moving averages, and a data range of the moving averages is preferably from 20 to 40 mm.

In this way, the smoothing process is conducted by a method of moving averages, and a data range of the moving averages is from 20 to 40 mm. Thus obtained maximum value shows a still stronger correlation with nanotopography of the wafer surface after being polished.

Furthermore, the surface profile of the semiconductor wafer is preferably measured by any one of an atomic force microscope method, a contact probe method and an electrical capacitance method.

In this way, the surface profile of the semiconductor wafer is measured by any one of an atomic force microscope method, a contact probe method and an electrical capacitance method, thereby conducting the measurement readily with conventional measurement apparatuses.

The present invention also provides an apparatus for evaluating a semiconductor wafer at least comprising: a surface profile measuring means for measuring a surface profile of a semiconductor wafer in a direction that the wafer is sliced; a data processing means for determining a maximum inclination value of warp change of the wafer surface based on data of a sectional profile in the direction that the wafer is sliced of the surface profile; and an evaluating means for evaluating nanotopography of the surface on a pass/fail basis by comparing the maximum inclination value of warp change with a reference value.

Such an evaluation apparatus at least comprising: a surface profile measuring means for measuring a surface profile of a semiconductor wafer in a direction that the wafer is sliced; a data processing means for determining a maximum inclination value of warp change of the wafer surface based on data of a sectional profile in the direction that the wafer is sliced of the surface profile; and an evaluating means for evaluating nanotopography of the surface on a pass/fail basis by comparing the maximum inclination value of warp change with a reference value, provides the maximum value showing a strong correlation with nanotopography of the wafer surface after being polished. The maximum value is compared with a reference value, thereby accurately estimating nanotopography of the wafer surface after being polished on a pass/fail basis based on the surface profile prior to polishing of the surface by using the apparatus.

In this case, the maximum inclination value of warp change to be determined is preferably defined as a maximum value among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or the maximum inclination value of warp change is preferably defined as a value obtained by dividing a warp variation by a distance between where the warp starts changing and where the warp finishes changing.

In this way, when the maximum inclination value of warp change to be determined is defined as a maximum value (Line Δ Warp) among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or the maximum inclination value of warp change is defined as a value (degree of Warp change) obtained by dividing a warp variation by a distance between where the warp starts changing and where the warp finishes changing, the maximum inclination value shows a particularly strong correlation with nanotopography of the wafer surface after being polished. As a result, nanotopography of the wafer surface after being polished can be estimated on a pass/fail basis more accurately with such an evaluation apparatus.

Furthermore, the data processing means preferably subjects the sectional profile to a smoothing process and then determines the maximum inclination value of warp change.

In this way, when the data processing means subjects the sectional profile to a smoothing process such as a method of moving averages, a method of moving median, or a polynomial-based smoothing method and then determines the maximum inclination value of warp change, the maximum value shows a stronger correlation with nanotopography of the wafer surface after being polished. As a result, nanotopography of the wafer surface after being polished can be estimated accurately with such an evaluation apparatus.

In the above case, the data processing means preferably conducts the smoothing process by a method of moving averages, and a data range of the moving averages is preferably from 20 to 40 mm.

As mentioned above, when the data processing means conducts the smoothing process by a method of moving averages, and a data range of the moving averages is from 20 to 40 mm, the maximum value to be determined shows a still stronger correlation with nanotopography of the wafer surface after being polished. As a result, nanotopography of the wafer surface after being polished can be estimated more accurately with such an evaluation apparatus.

The surface profile measuring means is preferably any one of an atomic force microscope, a contact-probe-type profile measuring system and an electrical-capacitance-type profile measuring system.

As mentioned above, when the evaluation apparatus comprises the surface profile measuring means that is any one of an atomic force microscope, a contact-probe-type profile measuring system and an electrical-capacitance-type profile measuring system, the measurement can be conducted readily by using conventional measurement apparatuses.

Furthermore, the present invention provides a method for manufacturing a semiconductor wafer at least comprising slicing of a semiconductor ingot to obtain a wafer and polishing of the wafer, wherein a surface profile of the wafer is evaluated by the method according to any one of the abovementioned methods, and slicing conditions are adjusted based on results of the evaluation.

In this way, when a surface profile of a wafer is evaluated by any one of the abovementioned methods, and slicing conditions are adjusted based on results of the evaluation, the slicing conditions can be adjusted more swiftly prior to polishing of the wafer so that semiconductor wafers that have polished surfaces with good level of nanotopography can be manufactured, whereby such wafers can be manufactured efficiently.

Furthermore, the present invention provides a method for manufacturing a semiconductor wafer at least comprising slicing of a semiconductor ingot to obtain a wafer and polishing of the wafer, wherein a surface profile of the wafer is evaluated by the method according to any one of the abovementioned methods, and evaluating the wafer surface after being polished on a pass/fail basis based on results of the evaluation.

In this way, when a surface profile of the wafer is evaluated by the any one of the abovementioned methods, and evaluating the wafer surface after being polished on a pass/fail basis based on results of the evaluation, non-defective wafers are selected prior to polishing of wafers and passed to subsequent steps, whereby wafers having surfaces with good level of nanotopography can be manufactured efficiently.

According to the present invention, prior to polishing of the surface of a wafer, at least a surface profile of the wafer is measured in the direction that the wafer is sliced, and a maximum inclination value of warp change of the wafer surface is determined in a sectional profile in the direction that the wafer is sliced of the measured surface profile. Thus obtained maximum value shows a strong correlation with nanotopography of the wafer surface after being polished. As a result, nanotopography of the polished wafer surface can be accurately estimated based on the surface profile of the wafer prior to being polished.

When the evaluation apparatus according to the present invention is used, the evaluation apparatus comprising: a surface profile measuring means for measuring a surface profile of a semiconductor wafer in a direction that the wafer is sliced; a data processing means for determining a maximum inclination value of warp change of the wafer surface based on data of a sectional profile in the direction that the wafer is sliced of the surface profile; and an evaluating means for evaluating nanotopography of the surface on a pass/fail basis by comparing the maximum inclination value of warp change with a reference value, the determined maximum value shows a strong correlation with nanotopography of the wafer surface after being polished. Therefore, by comparing the maximum value with a reference value, nanotopography of the wafer surface after being polished can be accurately estimated on a pass/fail basis based on the surface profile prior to polishing of the surface with the apparatus.

Furthermore, when a surface profile of a wafer is evaluated by the method according to the present invention, and slicing conditions are adjusted based on results of the evaluation, the slicing conditions can be adjusted more swiftly so that semiconductor wafers that have polished surfaces with good level of nanotopography can be manufactured, whereby such wafers can be manufactured efficiently.

In addition, when a surface profile of a wafer is evaluated by the method according to the present invention, and evaluating the wafer surface after being polished on a pass/fail basis based on results of the evaluation, non-defective wafers are selected and passed to subsequent steps, whereby wafers that have surfaces with good level of nanotopography can be manufactured efficiently.

BRIEF EXPLANATION OF THE DRAWINGS

FIG. 9(a) is a graph showing an example of a measured sectional profile after a wafer is sliced; FIG. 9(b) is an explanatory view showing the direction of the measuring in FIG. 9(a); FIGS. 9(c), 9(d) and 9(e) are graphs showing examples of a nanotopography profile (nanotopo) and a Warp profile, where FIG. 9(c) is a nanotopography map, FIG. 9(d) is a top view, and FIG. 9(e) is a slice map.

BEST MODE FOR CARRYING OUT THE INVENTION

Hereinafter, a more thorough disclosure of the present invention is presented.

As mentioned above, parameters about warpage, Warp or the like based on the surface conditions of a wafer measured in the state of as-cut are not in correlation with nanotopography of the surface of the wafer after being polished. Therefore, in order to evaluate nanotopography of a wafer surface, it is necessary to conduct the evaluation after the wafer is subjected to a polishing step.

Therefore, in order to increase the efficiency of manufacturing wafers, there is a desire for a method in which nanotopography can be evaluated in a stage of a manufacture process as early as possible.

(Experiment 1)

First, in order to confirm problems of conventional techniques, the present inventors measured the Warp of a silicon wafer surface in the state of as-cut, and determined the correlation between the Warp and nanotopography values of the wafer surface measured after being polished.

As an indicator for representing nanotopography, HCT was used. HCT is an abbreviation of Height Change Threshold. HCT represents a threshold that is a ratio (% Area) of areas (failure areas) where Height Change among wafer surface heights in square measurement areas in pixel size exceeds a predetermined value to the measurement areas. HCTs were determined by CR83 SQM from ADE Corporation where the pixel size was 10 mm per side and the % Area was 0.5%.

Figure 3:
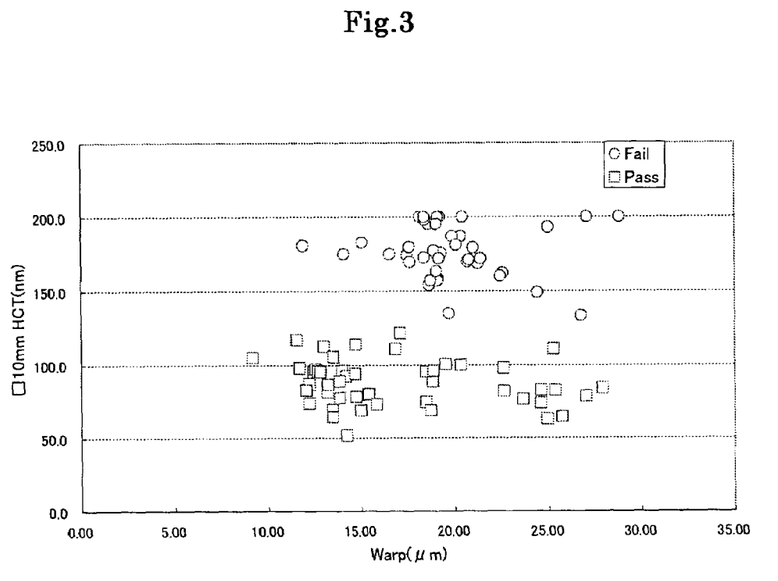
FIG. 3 is a graph showing a relation between Warp of the surface of a silicone wafer measured in the state of as-cut and nanotopography values of the wafer surface after being polished.

FIG. 3 shows the results. In FIG. 3, wafers with HCTs equal to or less than 125 nm are judged pass. As shown in FIG. 3, there is no correlation between the Warp in the state of as-cut and nanotopography of the polished wafer. Consequently, it has been confirmed that nanotopography of polished wafers cannot be evaluated based on the Warp.

Then the present inventors have thoroughly examined about evaluation parameters that can be measured from a wafer in the state of as-cut and also show a correlation with nanotopography of a wafer surface measured after being polished. As a result, the inventors have found that nanotopography of a polished wafer surface can be accurately estimated before the wafer is polished by measuring a surface profile of the wafer in the direction that the wafer is sliced; determining a maximum inclination value of warp change of the wafer surface in a sectional profile in the direction that the wafer is sliced of the measured surface profile; and estimating nanotopography of the wafer surface after being polished based on the determined maximum value.

(Experiment 2)

As mentioned above, maximum inclination values of warp change of a wafer surface in the state of as-cut after being sliced and nanotopography of the wafer surface after being polished were determined. The correlation between the maximum inclination values and the nanotopography were determined. As for the maximum inclination value of warp change, various definitions are conceivable. However, in the present invention, definitions of degree of Warp change and Line Δ Warp are newly introduced.

Figure 4:
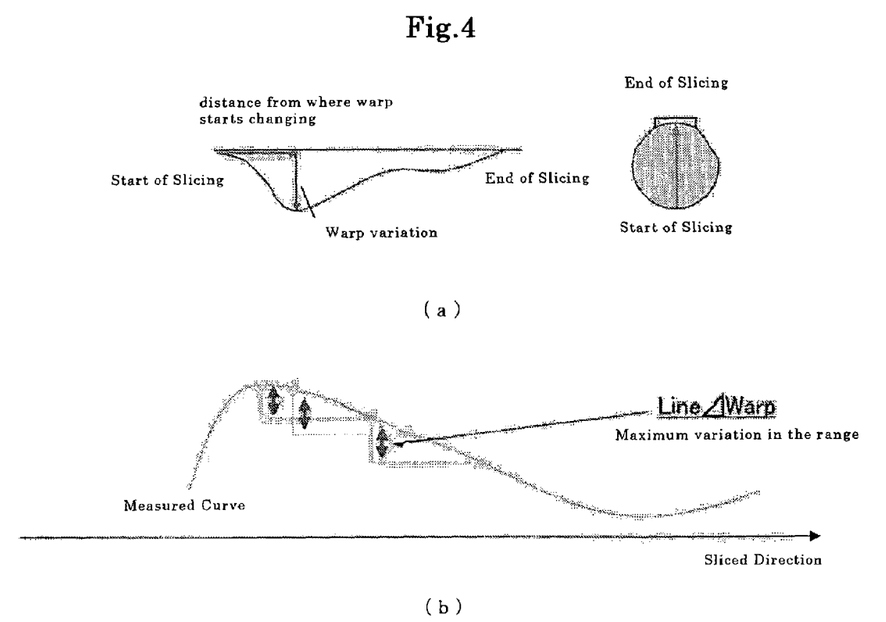
FIG. 4(a) is an explanatory view of degree of Warp change.
FIG. 4(b) is an explanatory view of Line Δ Warp.

The Warp change is, as shown in FIG. 4(a), defined as a value obtained by dividing a warp variation by a distance between where the warp starts changing and where the warp finishes changing during the start to the end of slicing of a wafer. The Line Δ Warp is, as shown in FIG. 4(b), a maximum value among variations of heights of the surface obtained in a measurement range being moved, the measurement range being set to have a predetermined width in a sectional profile (a measured curve in FIG. 4(b)) in the direction that the wafer is sliced and the measurement range being moved by a distance shorter than the width of the measurement range in the direction that the wafer is sliced.

FIG. 5(a) is a graph showing a correlation between degree of Warp change and nanotopography. FIG. 5(b) is a graph showing a correlation between Line Δ Warp and nanotopography when the width of the measurement range is 10 mm and the measurement range is moved by a distance of 0.5 mm. Both FIG. 5(a) and FIG. 5(b) have strong correlations. Contributing ratios $R^2$ of the linear regression curves are 0.7157 in FIG. 5(a) and 0.8361 in FIG. 5(b). The correlation is higher in Line Δ Warp. In measuring Line Δ Warp, the distance by which the measurement range is moved is preferably equal to the interval of points of measurement.

As mentioned above, the present inventors have confirmed that nanotopography of a polished wafer surface can be accurately estimated before the wafer is polished by using the abovementioned relations.

In view of the results, the present inventors have investigated thoroughly various conditions, thereby accomplishing the present invention.

Hereinafter, embodiments of the present invention are described with referring to drawings, however, the present invention is not limited thereto.

Figure 1:
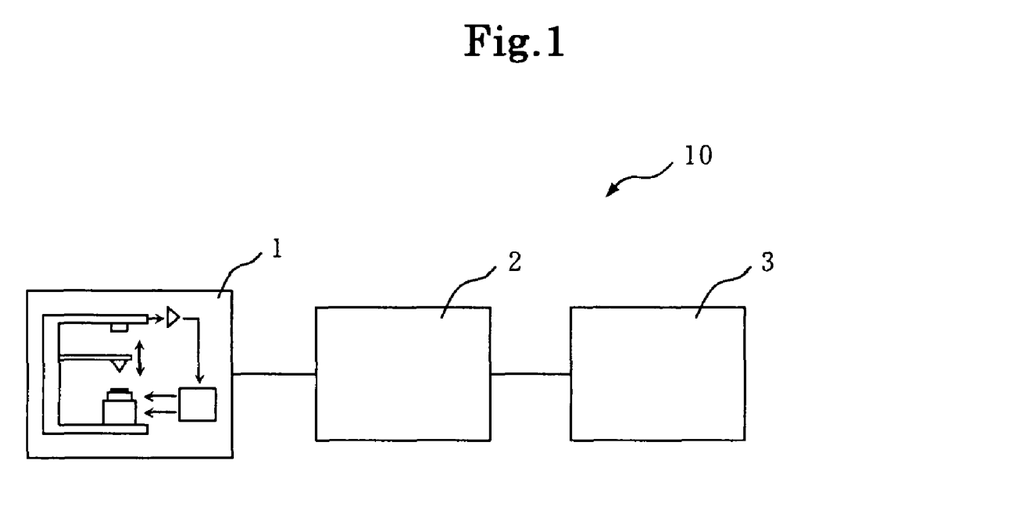
FIG. 1 is a schematic view of an embodiment of the apparatus for evaluating a semiconductor wafer according to the present invention.

FIG. 1 is a schematic view of an embodiment of the apparatus for evaluating a semiconductor wafer according to the present invention.

An evaluation apparatus 10 comprises a surface profile measuring means 1 for measuring a surface profile of a semiconductor wafer in a direction that the wafer is sliced; a data processing means 2 for determining a maximum inclination value of warp change of the wafer surface based on data of a sectional profile in the direction that the wafer is sliced of the surface profile; and an evaluating means 3 for evaluating nanotopography of the surface on a pass/fail basis by comparing the maximum inclination value of warp change with a reference value.

In this case, various definitions are conceivable as the maximum inclination value of warp change determined by the data processing means 2. However, the maximum inclination value of warp change is preferably a maximum value (Line Δ Warp) among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or a value (degree of Warp change) obtained by dividing a warp variation by a distance between where the warp starts changing and where the warp finishes changing. The Line Δ Warp and the degree of Warp change show particularly strong correlations with nanotopography of the wafer surface after being polished. As a result, nanotopography of the wafer surface after being polished can be evaluated more accurately on a pass/fail basis.

When the data processing means 2 subjects the sectional profile to a smoothing process such as a method of moving averages, a method of moving median, a polynomial-based smoothing method and then determines the maximum inclination value of warp change, the maximum value shows a stronger correlation with nanotopography of the wafer surface after being polished. As a result, nanotopography of the wafer surface after being polished can be estimated accurately.

When the data processing means 2 conducts the smoothing process by a method of moving averages, and a data range of the moving averages is from 20 to 40 mm, the maximum value shows a still stronger correlation with nanotopography of the wafer surface after being polished. As a result, nanotopography of the wafer surface after being polished can be evaluated more precisely.

The surface profile measuring means 1 is not particularly restricted as long as a surface profile can be measured. However, the surface profile measuring means 1 is preferably any one of an atomic force microscope, a contact-probe-type profile measuring system and an electrical-capacitance-type profile measuring system because the measurement can be conducted readily by using conventional measurement apparatuses.

Figure 2:
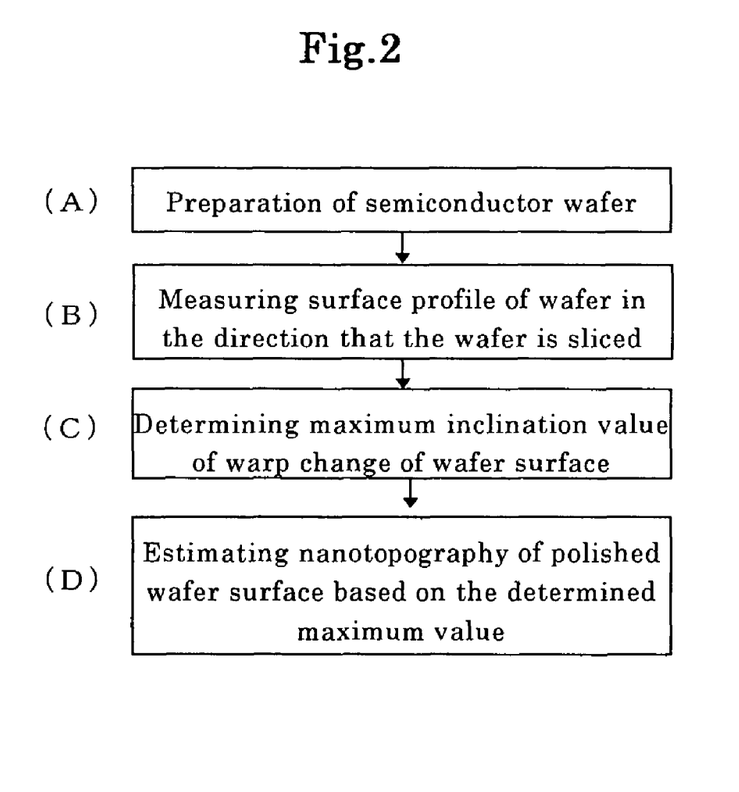
FIG. 2 is a flow chart of an embodiment of the method for evaluating a semiconductor wafer according to the present invention.

A method for evaluating a semiconductor wafer according to the present invention is now described with referring to the case of using the evaluation apparatus 10 in FIG. 1. FIG. 2 is a flow chart of an embodiment of such a method for evaluating a semiconductor wafer.

First, a semiconductor wafer sliced from a semiconductor ingot of silicon, compound semiconductor, or the like is prepared (Step A).

The semiconductor ingot can be grown by the conventional CZ method or FZ method, however, not particularly restricted thereto. The semiconductor ingot can be sliced with a conventional wire saw. As a matter of course, an inner diameter slicer or an outer diameter slicer can also be used. In addition, after a wafer is sliced, the wafer can be cleaned if necessary.

Next, a surface profile of the wafer in the direction that the wafer is sliced is measured with the surface profile measuring means 1 (Step B).

Figure 9:
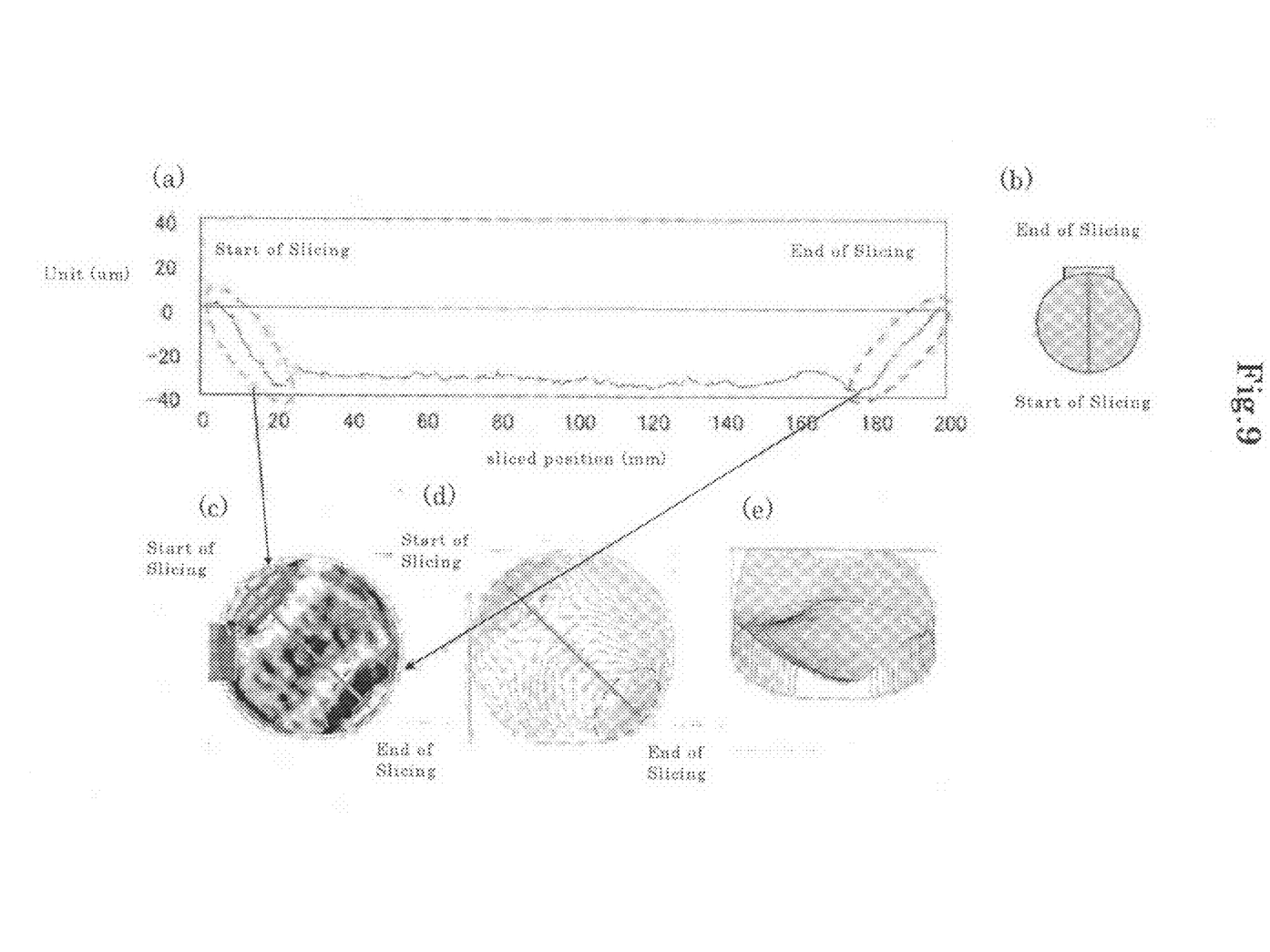

In this case, the surface profile is measured at least in the direction that the wafer is sliced over the wafer surface. As a matter of course, the surface profile of the whole wafer surface can be measured. The reason to measure the surface profile in the direction that the wafer is sliced is that this direction particularly has a great impact on nanotopography. FIG. 9(*a*) is a graph showing an example of a measured sectional profile after a wafer is sliced; FIG. 9(*b*) is an explanatory view showing the direction of the measuring in FIG. 9(*a*); FIGS. 9(*c*), 9(*d*) and 9(*e*) are graphs showing examples of a nanotopography profile (nanotopo) and a Warp profile, FIG. 9(*c*) is a nanotopography map, FIG. 9(*d*) is a top view, and FIG. 9(*e*) is a slice map. As shown in FIGS. 9(*a*) to (*e*), the direction that the wafer is sliced particularly has a great adverse impact on nanotopography, resulting in degraded nanotopography.

The surface profile can be measured after conducting chamfering, lapping or the like as long as after a wafer is sliced and before the wafer is polished. However, when the wafer is subjected to the measuring of a surface profile in the state of as-cut, namely not being processed after the slicing, nanotopography of the wafer surface can be evaluated in an early stage of the process of manufacturing wafers. Therefore, slicing conditions or the like are swiftly controlled in response to the evaluation results, whereby wafers to be rejected in terms of nanotopography are prevented from being sent to subsequent steps as much as possible, and productivity of wafers can be increased.

Furthermore, a surface profile of a semiconductor wafer is measured by any one of an atomic force microscope method, a contact probe method and an electrical capacitance method, thereby conducting the measurement readily with conventional measurement apparatuses.

Then a maximum inclination value of warp change of the wafer surface is determined with the data processing means 2 based on a sectional profile in the direction that the wafer is sliced of thus-measured surface profile (Step C).

As for the maximum inclination value of warp change, various definitions are conceivable. However, when the maximum inclination value is defined as the Line Δ Warp or the degree of Warp change, nanotopography of the wafer surface after being polished can be estimated more accurately because the Line Δ Warp and the degree of Warp change show particularly strong correlations with nanotopography of the wafer surface after being polished.

In the above case, the sectional profile is preferably subjected to a smoothing process and then the maximum inclination value of warp change is determined.

Figure 6:
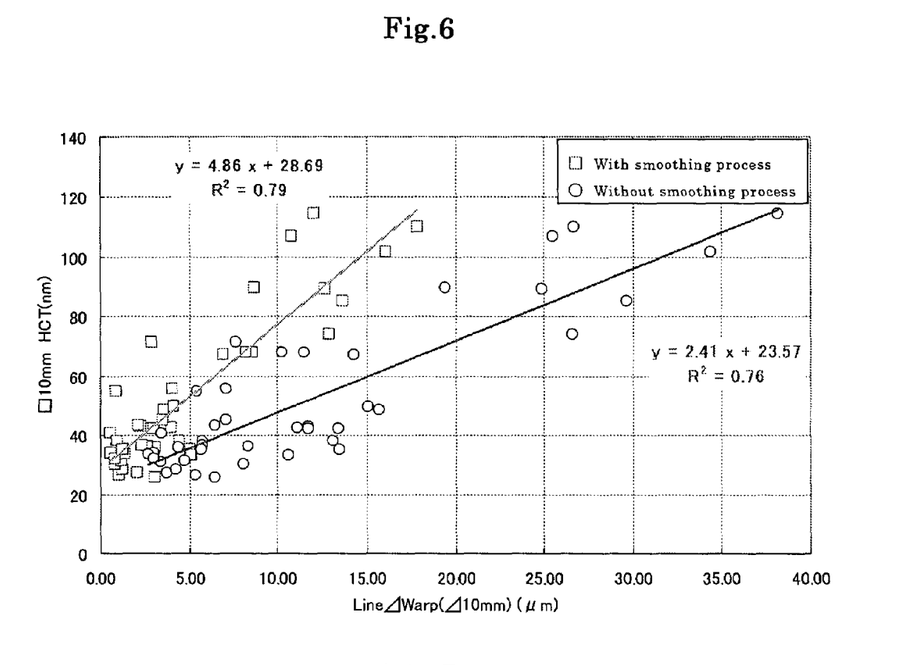
FIG. 6 is an example of a graph showing correlations between Line Δ Warp and nanotopography after polishing in the case of conducting and not conducting a smoothing process by a method of moving averages.

FIG. 6 is an example of a graph showing relations between Line Δ Warp and nanotopography after polishing in the case of conducting and not conducting a smoothing process using moving averages. In calculating Line Δ Warp, the width of the measurement range was 10 mm and the measurement range was moved by a distance of 0.5 mm. In this example, in the case of conducting a smoothing process by a method of moving averages where a data range of the moving averages was 30 mm, a contributing ratio $R^2$ was 0.79, which was larger than a contributing ratio $R^2$ of 0.76 in the case of not conducting a smoothing process by a method of moving averages. Therefore, the smoothing process by a method of moving averages is preferably conducted because the correlation between Line Δ Warp and nanotopography after polishing can be high. In other examples, the same tendency was observed.

Furthermore, the correlation between the determined maximum value and nanotopography of a wafer surface after being polished can be still higher by conducting the smoothing process by a method of moving averages where a data range of the moving averages is from 20 to 40 mm.

Table 1 shows contributing ratios (contributing ratio A) between Line Δ Warp determined in the state of as-cut and Line Δ Warp determined after polishing; and contributing ratios (contributing ratio B) between Line Δ Warp determined in the state of as-cut and HCT determined after polishing. As for the Line Δ Warp determined in the state of as-cut, a data range (moving average range) of the moving averages was 4 to 60 mm. As for the Line Δ Warp determined after polishing, a moving average range was 4 mm.

TABLE 1

| | Moving average range (mm) | | | | | |
|---|---|---|---|---|---|---|
| | 4 | 10 | 20 | 30 | 40 | 60 |
| contributing ratio A | 0.34 | 0.55 | 0.75 | 0.90 | 0.84 | 0.66 |
| contributing ratio B | 0.22 | 0.33 | 0.65 | 0.73 | 0.61 | 0.48 |

As is evident from Table 1, by setting the moving average range to be from 20 to 40 mm, the contributing ratios A and B become high. As a result, the correlation between determined Line Δ Warp and nanotopography of a wafer surface after being polished can be still higher.

When the Line Δ Warp is determined, the width of the measurement range is preferably equal to or less than 20 mm.

Figure 7:
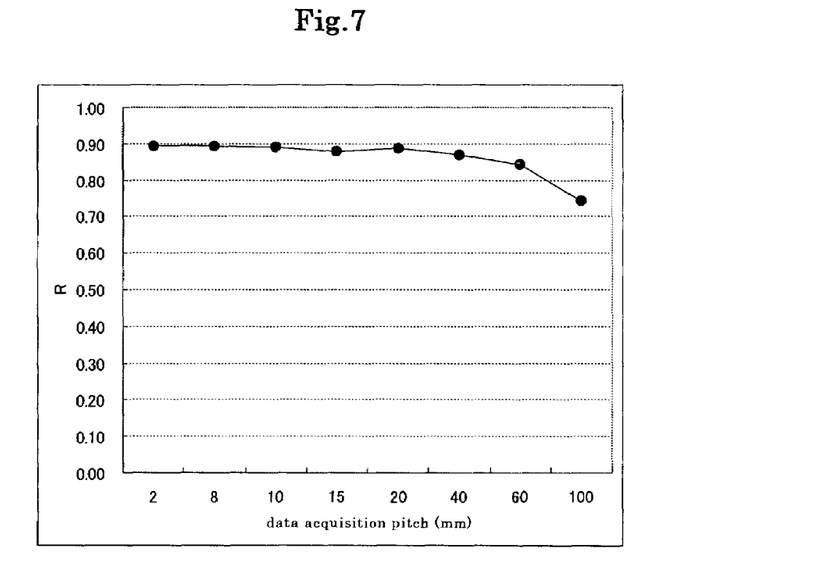
FIG. 7 is a graph showing a relation between a width of the measurement range and correlation coefficient in the case of obtaining Line Δ Warp.

FIG. 7 is a graph showing a relation between a width (data acquisition pitch) of the measurement range and a correlation coefficient R. As shown in FIG. 7, by setting the width of the measurement range to be equal to or less than 20 mm, the correlation between Line Δ Warp and nanotopography after polishing can be still higher. Based on FIG. 7, a preferred lower limit of the width of the measurement range can be a settable minimum value. For example, the lower limit can be 0.1 mm or more depending on an object.

Furthermore, the correlation can be yet higher as necessary by subjecting the sectional profile to a filtering treatment to remove noise.

Then nanotopography of the polished wafer surface is estimated based on the determined maximum value by using the evaluating means 3 (Step D).

For example, based on the determined Line Δ Warp, nanotopography of the wafer surface after being polished is evaluated on a pass/fail basis by using a previously determined correlation function or the like. Alternatively, by comparing the determined Line Δ Warp with a previously determined reference value, nanotopography of the wafer surface is evaluated on a pass/fail basis. In this way, nanotopography of the polished wafer surface can be accurately estimated based on the surface profile prior to polishing.

Next, a method for manufacturing a semiconductor wafer according to the present invention is described. The manufacturing method provided by the present invention is characterized by comprising slicing of a semiconductor ingot to obtain a wafer and polishing of the wafer, wherein a surface profile of the wafer is evaluated by the method according to the Steps (A) to (D), and slicing conditions are adjusted based on results of the evaluation.

As a result, the slicing conditions can be adjusted more swiftly so that semiconductor wafers that have polished surfaces with good levels of nanotopography can be manufactured, whereby the number of wafers to be rejected due to poor nanotopography is reduced, and wafers having surfaces with good levels of nanotopography can be manufactured efficiently.

As for the adjusting of slicing conditions, for example, tension of a wire of a wire saw can be adjusted, or a temperature of a slurry or the amount of silicon contained in the slurry can be adjusted. A break of wires, wear of a main roller, or the like can be checked. When necessary, the wires and the slurry are preferably changed.

Another manufacturing method according to the present invention is characterized by comprising slicing of a semiconductor ingot to obtain a wafer and polishing of the wafer, wherein a surface profile of the wafer is evaluated by the method according to the Steps (A) to (D) prior to the polishing, and evaluating the wafer surface after being polished on a pass/fail basis based on results of the evaluation.

In this way, by evaluating the wafer surface after being polished, wafers to be polished to have poor surface nanotopography are not passed to subsequent steps while only wafers to be evaluated non-defective are selected and passed to subsequent steps, whereby only wafers that have surfaces with good levels of nanotopography can be manufactured efficiently.

Figure 5:
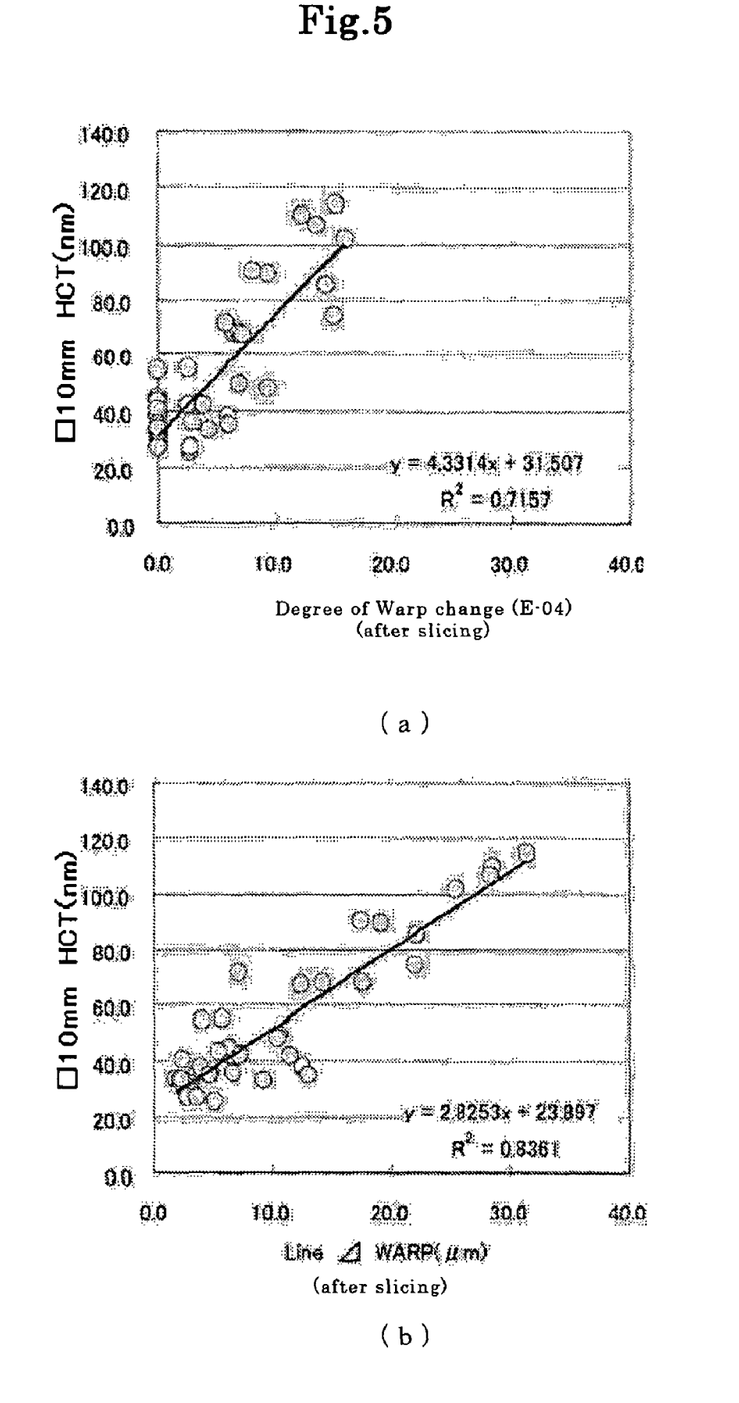
FIG. 5(a) is a graph showing a correlation between degree of Warp change and nanotopography.
FIG. 5(b) is a graph showing a correlation between Line Δ Warp and nanotopography when the width of the measurement range is 10 mm.

The evaluation on a pass/fail basis can be conducted by determining a correlation such as in FIG. 5 or 6, setting a reference value of Line Δ Warp functioning as an acceptance standard with which an acceptable level of nanotopography is evaluated, and evaluating wafers with Line Δ Warp smaller than the acceptance standard as non-defective and passing such wafers to subsequent steps.

Hereinafter, the present invention is described further in detail with referring to Example, however, the present invention is not restricted thereto.

Example

Figure 8:
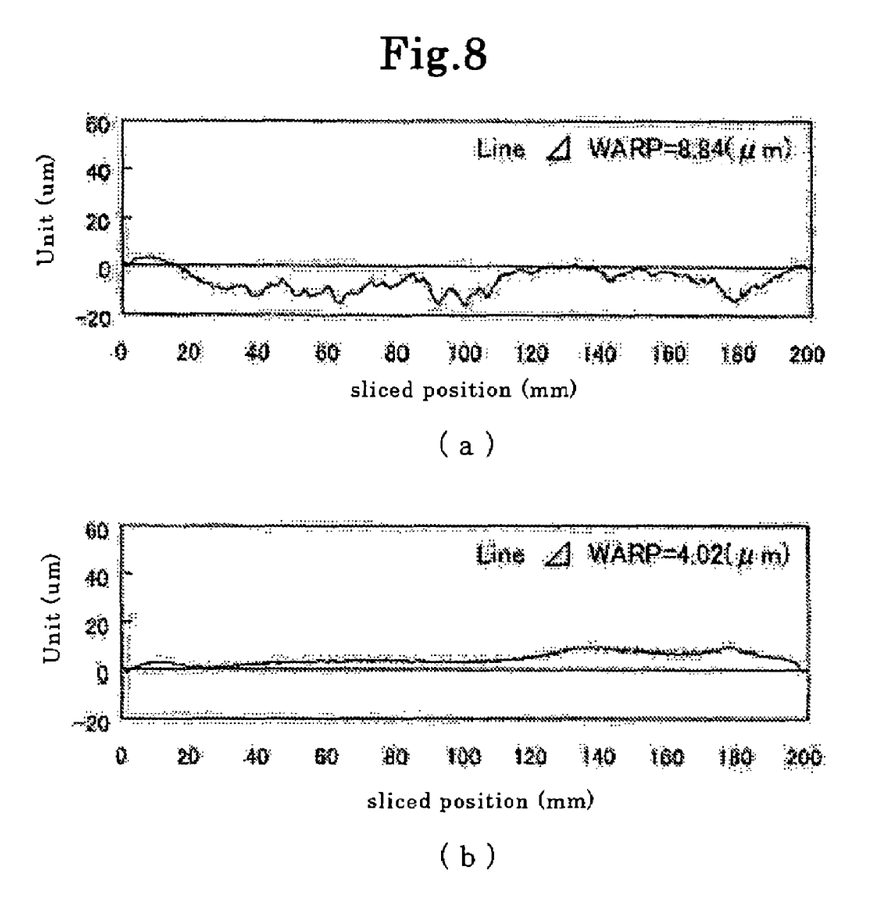
FIG. 8(a) shows a result of measuring a surface profile in Example before slicing conditions are adjusted.
FIG. 8(b) shows a result of measuring a surface profile in Example after slicing conditions are adjusted.

A silicon wafer was prepared by slicing a silicon single crystal ingot with a diameter of 200 mm grown by CZ method with a wire saw. A surface profile of the wafer in the state of as-cut was measured in the direction that the wafer is sliced with a contact-probe-type profile measuring system. The measurement results are shown in FIG. 8(*a*). Line Δ Warp was 8.84 μm where the width of a measurement range was 10 mm and the measurement range was moved by a distance of 0.5 mm.

The Line Δ Warp was larger than 6 μm, which was set as a reference value. Therefore, the wafer was evaluated to be defective in terms of nanotopography after being polished. The wafer was not passed to subsequent steps. In response to the evaluation results of the Line Δ Warp, slicing conditions were adjusted and optimized by adjusting the tension of the wire saw.

Under the slicing conditions thus optimized, the silicon single crystal ingot was sliced again to prepare a silicon wafer. A surface profile of the wafer in the state of as-cut was measured in the direction that the wafer is sliced with a contact-probe-type profile measuring system. The measurement results are shown in FIG. 8(*b*). This time Line Δ Warp was 4.02 μm, which was lower than the reference value. Thus the slicing process was improved. Then the wafers were subjected to a polishing process to produce silicon mirror surface wafers. Nanotopography of the mirror surface wafers were measured. As a result, HCTs of all the wafers were equal to or less than 60 nm, and all the wafers were non-defective.

The present invention is not limited to the embodiments described above. The above-described embodiments are mere examples, and those having substantially the same structure as technical ideas described in the appended claims and providing the similar functions and advantages are included in the scope of the present invention.

The invention claimed is:

1. A method for evaluating nanotopography of a surface of a semiconductor wafer sliced from a semiconductor ingot, the method being conducted prior to polishing of the surface, the method at least comprising: measuring a surface profile of the wafer in the direction that the wafer is sliced; determining a maximum inclination value of warp change of the wafer surface in a sectional profile in the direction that the wafer is sliced of the measured surface profile; and estimating nanotopography of the wafer surface after being polished based on the determined maximum value.

2. The method for evaluating a semiconductor wafer according to claim 1, wherein the maximum inclination value of warp change to be determined is defined as a maximum value among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or the maximum inclination value of warp change is defined as a value obtained by dividing a warp variation by a distance between where the warp starts changing and where the warp finishes changing.

3. The method for evaluating a semiconductor wafer according to claim 2, wherein the width of the measurement range is equal to or less than 20 mm.

4. The method for evaluating a semiconductor wafer according to claim 1, wherein the wafer is subjected to the measuring of a surface profile in a state of as-cut, namely not being processed after the slicing.

5. The method for evaluating a semiconductor wafer according to claim 2, wherein the wafer is subjected to the measuring of a surface profile in a state of as-cut, namely not being processed after the slicing.

6. The method for evaluating a semiconductor wafer according to claim 3, wherein the wafer is subjected to the measuring of a surface profile in a state of as-cut, namely not being processed after the slicing.

7. The method for evaluating a semiconductor wafer according to claim 1, wherein the sectional profile is subjected to a smoothing process and then the maximum inclination value of warp change is determined.

8. The method for evaluating a semiconductor wafer according to claim 2, wherein the sectional profile is subjected to a smoothing process and then the maximum inclination value of warp change is determined.

9. The method for evaluating a semiconductor wafer according to claim 7, wherein the smoothing process is conducted by a method of moving averages, and a data range of the moving averages is from 20 to 40 mm.

10. The method for evaluating a semiconductor wafer according to claim 7, wherein the smoothing process is conducted by a method of moving averages, and a data range of the moving averages is from 20 to 40 mm.

11. The method for evaluating a semiconductor wafer according to claim 1, wherein the surface profile of the semiconductor wafer is measured by any one of an atomic force microscope method, a contact probe method and an electrical capacitance method.

12. The method for evaluating a semiconductor wafer according to claim 2, wherein the surface profile of the semiconductor wafer is measured by any one of an atomic force microscope method, a contact probe method and an electrical capacitance method.

13. An apparatus for evaluating a semiconductor wafer at least comprising: a surface profile measuring means for measuring a surface profile of a semiconductor wafer in a direction that the wafer is sliced; a data processing means for determining a maximum inclination value of warp change of the wafer surface based on data of a sectional profile in the direction that the wafer is sliced of the surface profile; and an evaluating means for evaluating nanotopography of the surface on a pass/fail basis by comparing the maximum inclination value of warp change with a reference value.

14. The apparatus for evaluating a semiconductor wafer according to claim 13, wherein the maximum inclination value of warp change to be determined is defined as a maximum value among variations of heights of the surface obtained in a measurement range being moved, the measurement range being set to have a predetermined width in the direction that the wafer is sliced and the measurement range being moved by a distance shorter than the width of the measurement range in the direction that the wafer is sliced; or the maximum inclination value of warp change is defined as a value obtained by dividing a warp variation by a distance between where the warp starts changing and where the warp finishes changing.

15. The apparatus for evaluating a semiconductor wafer according to claim 13, wherein the data processing means subjects the sectional profile to a smoothing process and then determines the maximum inclination value of warp change.

16. The apparatus for evaluating a semiconductor wafer according to claim 14, wherein the data processing means subjects the sectional profile to a smoothing process and then determines the maximum inclination value of warp change.

17. The apparatus for evaluating a semiconductor wafer according to claim 15, wherein the data processing means conducts the smoothing process by a method of moving averages, and a data range of the moving averages is from 20 to 40 mm.

18. The apparatus for evaluating a semiconductor wafer according to claim 16, wherein the data processing means conducts the smoothing process by a method of moving averages, and a data range of the moving averages is from 20 to 40 mm.

19. The apparatus for evaluating a semiconductor wafer according to claim 13, wherein the surface profile measuring means is any one of an atomic force microscope, a contact-probe-type profile measuring system and an electrical-capacitance-type profile measuring system.

20. The apparatus for evaluating a semiconductor wafer according to claim 14, wherein the surface profile measuring means is any one of an atomic force microscope, a contact-probe-type profile measuring system and an electrical-capacitance-type profile measuring system.

* * * * *